United States Patent [19]

Ohyama et al.

[11] Patent Number: 4,574,201
[45] Date of Patent: Mar. 4, 1986

[54] RADIO FREQUENCY SWITCHING CIRCUIT DEVICE

[75] Inventors: Toru Ohyama, Miyagi; Takao Nomura, Kakuda, both of Japan

[73] Assignee: Alps Electric Co., Ltd., Japan

[21] Appl. No.: 423,115

[22] Filed: Sep. 24, 1982

[30] Foreign Application Priority Data

Sep. 28, 1981 [JP] Japan .......................... 56-143611[U]

[51] Int. Cl.$^4$ ......................... H03K 17/56; H03H 7/00
[52] U.S. Cl. ................................... 307/243; 307/256; 307/253; 333/176
[58] Field of Search ............... 307/253, 239, 240, 241, 307/243, 256; 333/175, 176

[56] References Cited

U.S. PATENT DOCUMENTS

| | | | |
|---|---|---|---|
| 3,334,246 | 8/1967 | Drew et al. ......................... | 307/243 |
| 3,421,019 | 1/1969 | Reiser ................................. | 307/239 |
| 4,433,315 | 2/1984 | Vandegraaf ........................ | 333/176 |

FOREIGN PATENT DOCUMENTS 103231  6/1983  Japan .................................. 307/243

Primary Examiner—Stanley D. Miller
Assistant Examiner—B. P. Davis
Attorney, Agent, or Firm—Guy W. Shoup

[57] ABSTRACT

A radio frequency switching circuit device wherein an LC circuit is inserted between two terminals, while a diode is shunted, and wherein the diode is controlled into its nonconductive state and its conductive state by a D.C. voltage, whereby the path between the two terminals is switched into a conductive state and a nonconductive state with respect to a radio frequency signal; characterized in that a transistor which turns "on" upon the application of the D.C. voltage is inserted in series with a D.C. voltage terminal for applying the D.C. voltage to the diode.

8 Claims, 13 Drawing Figures

Fig. 1
PRIOR ART
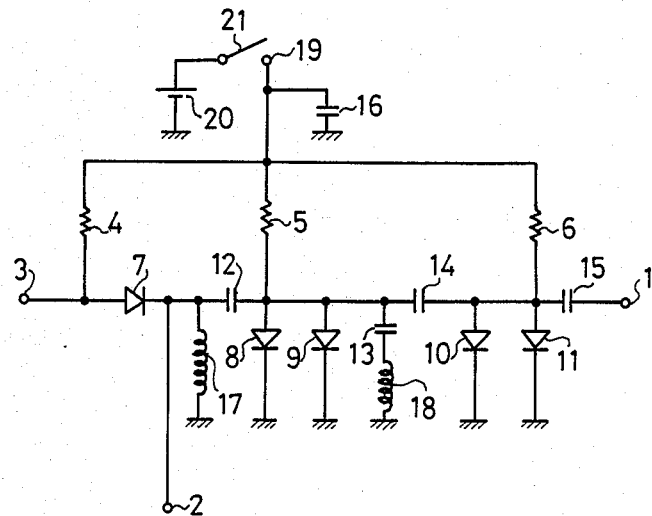
Fig. 2(A)
PRIOR ART
Fig. 2(B)
PRIOR ART
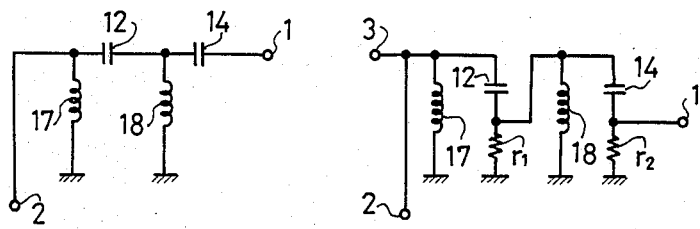
Fig. 3
PRIOR ART
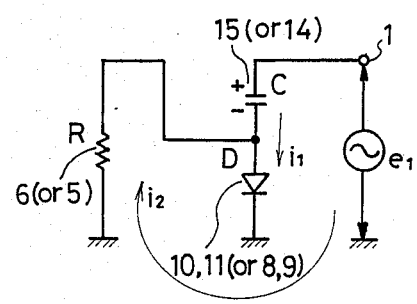

RADIO FREQUENCY SWITCHING CIRCUIT DEVICE

BACKGROUND OF THE INVENTION

The present invention relates to a device for switching between signals of different radio frequencies. More particularly, it relates to a radio frequency switching circuit device wherein an LC circuit is inserted between two terminals, while a diode is shunted, and wherein the diode is controlled into its nonconductive state and its conductive state by a D.C. voltage, whereby the path between the two terminals is switched between a conductive state and a nonconductive state with respect to a radio frequency signal.

In, for example, video equipment etc., there have heretofore been used radio frequency switching circuit devices in which two or more radio frequency signals are switched and then supplied to a single terminal. As will be described in detail later, such devices have the disadvantages of inferior intermodulation characteristics and a heavy transmission loss.

SUMMARY OF THE INVENTION

An object of the present invention is to provide a radio frequency switching circuit device free from the disadvantages of the prior art.

In one aspect of performance of the present invention, there is provided a radio frequency switching circuit device comprising first and second terminals at which radio frequency signals are respectively received, a D.C. voltage terminal to which a D.C. voltage is applied, switching means controlled "on" and "off" by the D.C. voltage, a resonance circuit which traps the radio frequency signal, and a transistor which is connected in series with said D.C. voltage terminal for applying said D.C. voltage to said switching means.

BRIEF DESCRIPTION OF THE DRAWINGS

FIG. 1, FIGS. 2(A) and 2(B), FIG. 3 and FIG. 6 are diagrams for explaining a problem of the prior art which the present invention avoids;

DETAILED DESCRIPTION OF THE INVENTION

Figure 4:
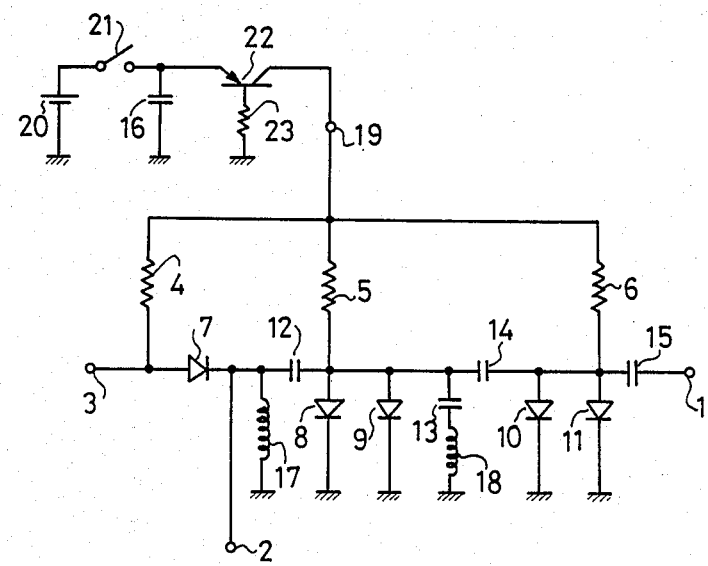
FIG. 4 is a diagram showing an embodiment of the present invention.

FIG. 1 shows an example of a radio frequency switching circuit device which has heretofore been known. Referring to the figure, numeral 1 designates a first terminal which is supplied with a first radio frequency signal, numeral 2 a second terminal which receives a switched radio frequency signal, and numeral 3 a third terminal which is supplied with a second radio frequency signal. Numerals 4 to 6 designate resistors which function to apply a D.C. voltage to diodes 7 to 11. Numerals 12 to 16 indicate capacitors, and numerals 17 and 18 inductors, respectively. Numeral 19 denotes a D.C. voltage terminal, numeral 20 a D.C. voltage source, and numeral 21 a switch.

In the arrangement shown in FIG. 1, when the switch 21 is in its "off" state, the diodes 7 to 11 are held in their nonconductive states. This situation is equivalent to a mode as shown in FIG. 2(A), and the radio frequency signal from the first terminal 1 is supplied to the second terminal 2 through a constant-K type high-pass filter. The signal from the terminal 3 is blocked by the diode 7. On the other hand, when the switch 21 is in its "on" state in the arrangement shown in FIG. 1, the diodes 7 to 11 are held in their conductive states. As a result, the radio frequency signal from the third terminal 3 is supplied to the terminal 2 as illustrated in FIG. 2(B). Herein, letting r1 represent the conduction resistance of the diodes 8 and 9 and r2 represent that of the diodes 10 and 11, the inductors 17 and the capacitor 12 construct a parallel resonance circuit, and the inductors 18 and the capacitor 14 construct another parallel resonance circuit, so that the radio frequency signal from the third terminal 3 is prevented from leaking to the first terminal 1.

The radio frequency switching circuit device as shown in FIG. 1 has heretofore been used though the present invention is not restricted thereto. When the operation in the case of the mode shown in FIG. 2(A) is further analyzed, it is noted that an aspect as illustrated in FIG. 3 appears. That is, in the positive half cycle of the radio frequency signal $e_1$ which is supplied to the first terminal 1, the capacitor C is charged as indicated at (+) and (−) and a current $i_1$ flows to the diode D, and in the negative half cycle of the radio frequency signal $e_1$, the charges stored in the capacitor C are discharged as indicated by a current $i_2$. In this case, when a time constant determined by C and R indicated is sufficiently large as compared with the period of the radio frequency signal $e_1$, the terminal voltage of the capacitor C remains in the state charged in the illustrated direction of (+) and (−), that is, it becomes the positive peak value $E_1$ of the radio frequency signal $e_1$. Thus, the diode D is reverse-biased properly, and the operation of the mode shown in FIG. 2(A) can be achieved properly.

Figure 6:
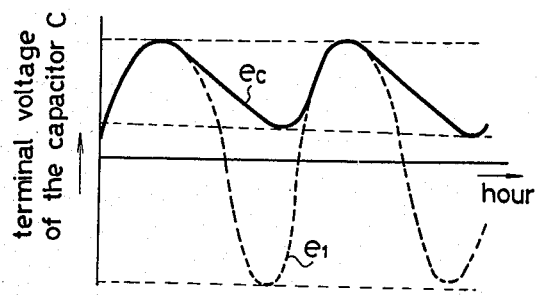

The capacitor C, however, functions as one element of the filter circuit as stated above and cannot assume a sufficiently large capacitance. In addition, the resistor R applies a reverse bias voltage to the diode and cannot assume a sufficiently large resistance. Accordingly, the terminal voltage $e_c$ of the capacitor C fluctuates in accordance with the radio frequency signal $e_1$ as illustrated in FIG. 6. In other words, the current $i_1$ intermittently flows into the diode D shown in FIG. 3. Difficulty attendant upon the inflow of the current will be described later, and results in inferior intermodulation characteristics as well as a heavy transmission loss.

The present invention solves the difficulty. FIG. 4 shows the arrangement of an embodiment of the present invention. Symbols in the figure correspond to those in FIG. 1, and numeral 22 indicates a PNP transistor and numeral 23 a resistor.

Referring to FIG. 4, when the switch 21 is in the "off" state, the diodes 7, 8, 9, 10 and 11 are in the nonconductive states, whereas when the switch 21 is in the "on" state, the transistor 22 turns "on" to bring the diodes 7, 8, 9, 10 and 11 into the conductive states. The basic operations as the radio frequency switch may be considered quite the same as in the case shown in FIG. 1.

Figure 5:
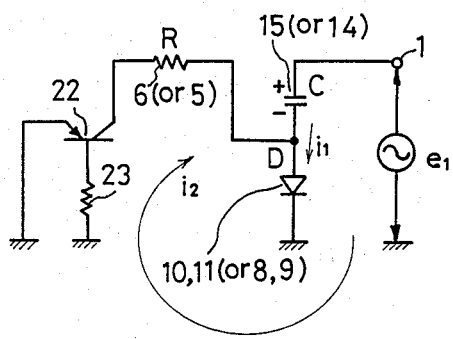
FIG. 5 and FIG. 7 are diagrams for explaining the operation of the embodiment shown in FIG. 4.
Figure 7:
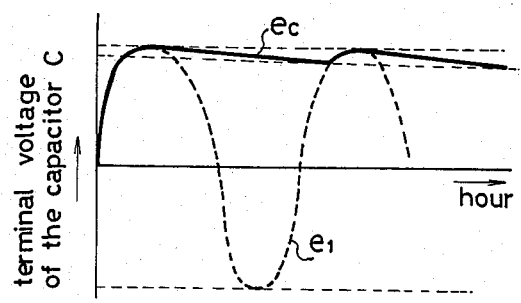

In the mode in which the diodes 7 to 11 are in the nonconductive states, however, the arrangement shown in FIG. 4 and that shown in FIG. 1 are different as understood by comparing FIG. 5 and FIG. 3. More specifically, in the illustration of FIG. 5, the discharging path of the capacitor C includes the transistor 22. In this case, the base current of the transistor 22 does not flow and this transistor 22 is substantially "off", so that the current $i_2$ scarcely flows. That is, the time constant of the discharging path in the case shown in FIG. 5 becomes sufficiently great, and the terminal voltage $e_c$ of the capacitor C hardly fluctuates as illustrated in FIG. 7. The capacitor C remains charged to the positive peak value of the radio frequency signal $e_1$, the current $i_1$ indicated in FIG. 5 flows scarcely, and the diode D falls into the nonconductive state substantially properly.

Figure 8:
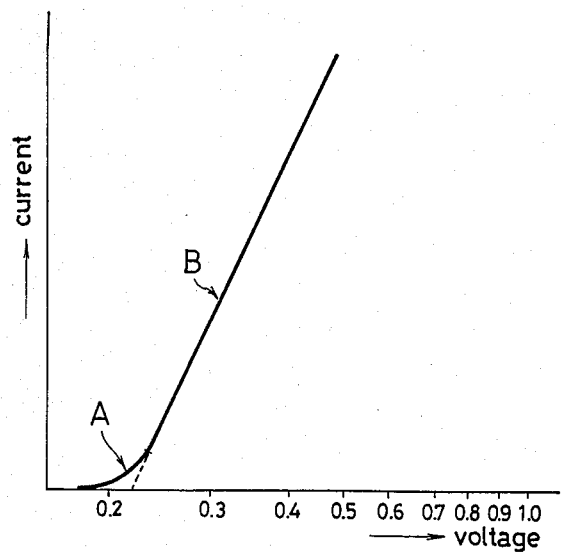
FIG. 8 is a diagram for explaining the aspects in which intermodulation distortions appear.

Now, let's consider the situation in which the undesired current flows through the diode D as explained with reference to FIGS. 3 and 6. Since the characteristics of the diode D are, in general, as shown in FIG. 8, the tertiary distortion is generated by a current corresponding to a part A shown in FIG. 8, and the secondary distortion is also generated by a current corresponding to a part B shown in FIG. 8. The intermodulation characteristics degrade, and the beat between the frequency $f_1$ of the radio frequency signal $e_1$ supplied to the first terminal 1 and the frequency $f_2$ of the radio frequency signal $e_2$ supplied to the third terminal 3 appears. When television receiving, for example, is performed with the signal received at the second terminal 2, undesirable beat stripes appear. This condition is more conspicuous as the amplitude of the radio frequency signal $e_1$ supplied to the first terminal increases.

Figure 9:
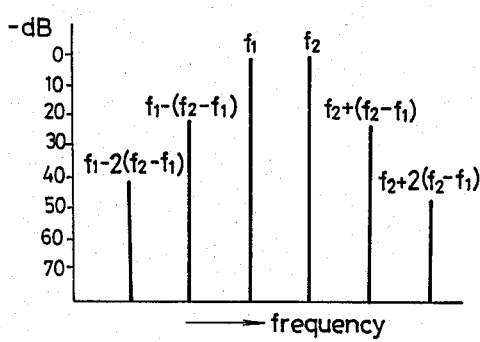
FIGS. 9 to 12 are diagrams for explaining the advantages of the present invention.
Figure 10:
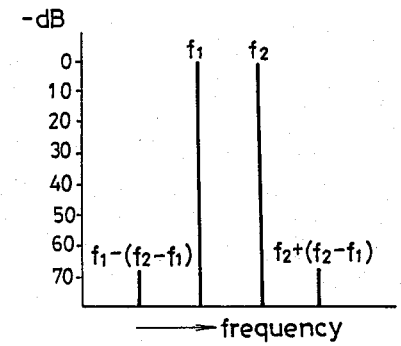

FIG. 9 represents an intermodulation spectrum due to the tertiary distortions which appear in the case of the arrangement shown in FIG. 1, while FIG. 10 represents an intermodulation spectrum due to the tertiary distortions which appear in the case of the arrangement shown in FIG. 4. As seen from the figures, the intermodulation distortion characteristics are greatly improved in the case of the present invention.

Figure 11:
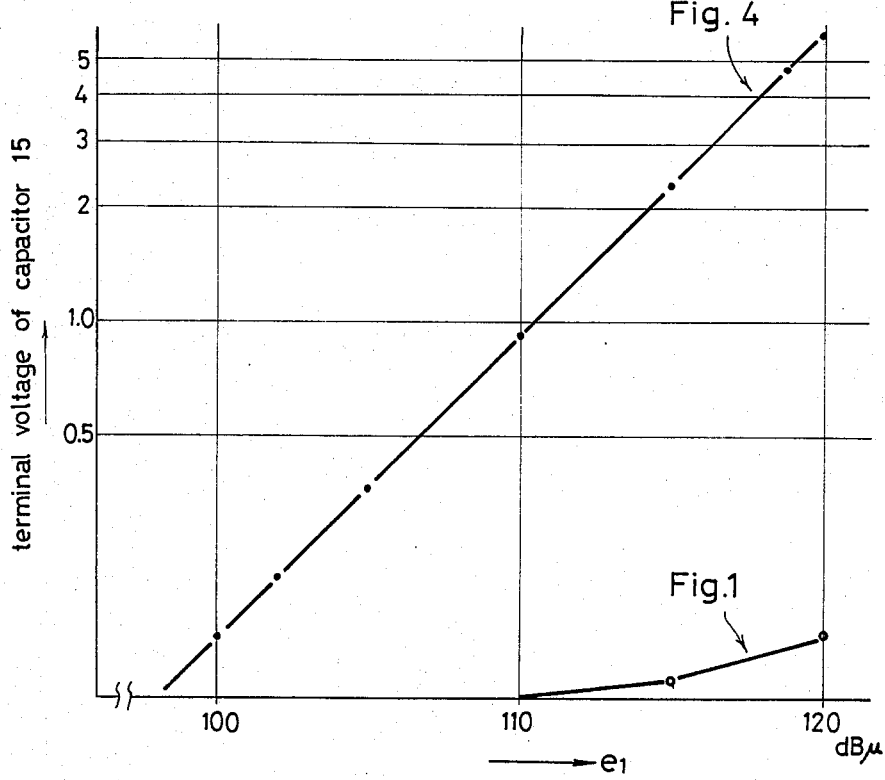

FIG. 11 shows the plots of the relationship of each arrangement between the amplitude of the radio frequency signal $e_1$ supplied to the first terminal 1 and the terminal voltage of the capacitor 15. In the case of the present invention (FIG. 4), it is seen that the terminal voltage of the capacitor 15 rises in correspondence with the amplitude of the radio frequency signal $e_1$ and that the action of preventing the current $i_1$ to flow through the diode D develops.

Figure 12:
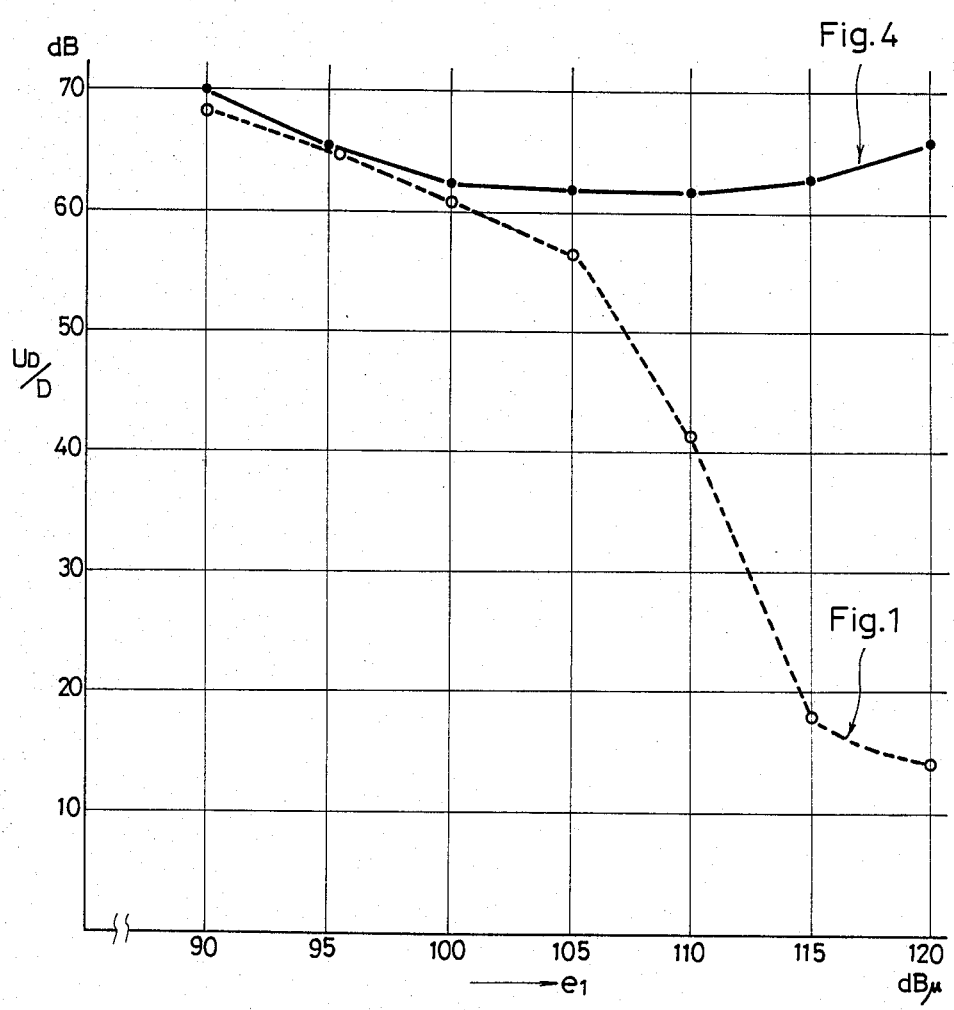

FIG. 12 represents the aspect in which the ratio ($U_D/D$) of the beat signal level $U_D$ to the signal level D of the radio frequency signal $e_1$ supplied to the first terminal 1 varies versus the amplitude of the signal $e_1$ in each arrangement. As seen from the figure, in the case of the arrangement shown in FIG. 1, the intermodulation characteristics degrade greatly with increase in the amplitude of the radio frequency signal $e_1$. In contrast, in the case of the arrangement shown in FIG. 4, the intermodulation characteristics do not degrade even when the amplitude of the radio frequency signal $e_1$ becomes large.

In case of the present invention, the diodes 7 to 11 are substantially nonconductive in the mode shown in FIG. 2(A). Therefore, the transmission loss does not increase due to the substantial lowering of the impedances of the respective diodes.

In the above, there has been described the changeover switch in the video equipment. Needless to say, however, the present invention is applicable to, for example, a switch in a radio frequency amplifier stage, a band change-over switch in a tuner, and a switch in the tuning power source of a tuner.

What is claimed is:

1. A device for switching between two radio frequency signals, comprising:
   means including first and second terminals for receiving respective radio frequency input signals;
   means including a D.C. voltage terminal for receiving a D.C. voltage;
   switching means controlled by the D.C. voltage to be in conductive or non-conductive states;
   means including a transistor connected in series with said D.C. voltage terminal for applying said D.C. voltage to said switching means; and
   a resonance circuit including a capacitor connected to said switching means and to said transistor for receiving input signals from said first and second terminals and for trapping one of the radio frequency signals by the operation of said switching means;
   said resonance circuit having an effective capacitance the discharging path of which includes said transistor, such that when the switching means is in a non-conductive state and the transistor is in a substantially off state, the time constant of the discharging path is sufficiently long relative to the frequencies of said radio frequency signals to keep the capacitance charged to maintain said switching means in the non-conductive state.

2. A radio frequency switching device according to claim 1, wherein said transistor is a PNP transistor.

3. A radio frequency switching device according to claim 1, wherein said transistor is controlled by the D.C. voltage from said D.C. voltage terminal.

4. A radio frequency switching device according to claim 1, wherein said switching means is a diode.

5. A radio frequency switching device according to claim 2, wherein said transistor is of the grounded-base type.

6. A radio frequency switching device according to claim 1, wherein a capacitor is interposed between said D.C. voltage terminal and said transistor.

7. A radio frequency switching device according to claim 1, wherein said resonance circuit is constructed of an inductance and a capacitor.

8. A radio frequency device according to claim 1, including an output terminal, and said switching means serving to switch either one of the radio frequency input signals to said output terminal.

* * * * *